United States Patent [19]

Malhi

[11] Patent Number: 5,202,276
[45] Date of Patent: Apr. 13, 1993

[54] METHOD OF FORMING A LOW ON-RESISTANCE DMOS VERTICAL TRANSISTOR STRUCTURE

[75] Inventor: Satwinder Malhi, Garland, Tex.

[73] Assignee: Texas Instruments Incorporated, Dallas, Tex.

[21] Appl. No.: 789,780

[22] Filed: Nov. 8, 1991

Related U.S. Application Data

[63] Continuation of Ser. No. 570,094, Aug. 20, 1990, abandoned.

[51] Int. Cl.$^5$ .......................................... H01L 21/265
[52] U.S. Cl. ........................................ 437/41; 437/44; 437/150; 437/913; 148/DIG. 126
[58] Field of Search .................... 437/41, 44, 42, 43, 437/40, 913, 150, 151, 154; 357/23.4, 23.9; 148/DIG. 126

[56] References Cited

U.S. PATENT DOCUMENTS

| | | | |
|---|---|---|---|
| 4,404,576 | 9/1983 | Ronen | 357/41 |
| 4,691,433 | 9/1987 | Pimbley et al. | 437/29 |
| 4,705,759 | 11/1987 | Lidow et al. | |
| 4,755,479 | 7/1988 | Miura | 437/44 |
| 4,757,032 | 7/1988 | Contiero | |
| 4,774,198 | 9/1988 | Contiero et al. | |
| 4,795,716 | 1/1989 | Yilmaz et al. | |
| 4,859,620 | 8/1989 | Wei et al. | 437/41 |
| 4,879,254 | 11/1989 | Tsuzuki et al. | |
| 4,931,408 | 6/1990 | Hshieh | 437/29 |
| 4,963,504 | 10/1990 | Huang | 437/44 |

FOREIGN PATENT DOCUMENTS

| | | | |
|---|---|---|---|
| 59-74674 | 4/1984 | Japan | 437/44 |
| 62-08567 | 1/1987 | Japan | 437/44 |
| 0286136 | 3/1990 | Japan | 437/44 |

OTHER PUBLICATIONS

On-resistance characterization of VDMOS power transistors; Tarng; 1981 IEEE; pp. 429-433.
Modeling of the On-Resistance of LDMOS, VDMOS, and VMOS power transistors; Sun et al.; IEEE 1980; pp. 356-367.
D-MOS Transistor for Microwave Applications; Sigg et al., pp. 45-53, Jan. 1972, U.S. (IEEE Transactions on Electron Devices; vol. ED-19, No. 1).
Optimum Design of Power MOSFET's; Chenming Hu et al., pp. 1693-1700, Dec., 1984, U.S. (IEEE Transactions on Electron Devices; vol. ED-31, No. 12).

Primary Examiner—Brian E. Hearn
Assistant Examiner—Michael Trinh
Attorney, Agent, or Firm—Richard A. Stoltz; James C. Kesterson; Richard L. Donaldson

[57] ABSTRACT

This is a DMOS transistor and a method of forming a DMOS transistor structure. The method comprises: forming a polycrystalline silicon central gate region; forming a drain region in the substrate self-aligned to the central gate region; forming polycrystalline silicon gate sidewalls adjacent to the gate region; and forming a source region in the substrate self-aligned to the edges of the sidewalls. It can provide a channel region which is significantly longer (Ld) than it is in depth (essentially Lj) can be produced between the source region and the drain region, and thus the method provides an optimization of the transistor for lower on-resistance and thus a DMOS device having a MOS channel length longer than its parasitic JFET channel length. Preferably channel regions are formed which are 0.25-0.75 um in depth and the channel regions have an Ld of 1.0-2.5 um.

4 Claims, 3 Drawing Sheets

METHOD OF FORMING A LOW ON-RESISTANCE DMOS VERTICAL TRANSISTOR STRUCTURE

This application is a division of application Ser. No. 07/570,094, filed Aug. 20, 1990, now abandoned.

BACKGROUND OF THE INVENTION

This invention relates generally to a method for fabricating MOS type devices, and, more particularly, to an improved method for fabricating double-diffused MOS (DMOS) transistors with vertical path of current.

In order to provide high voltage circuits for automotive and other power IC applications, high voltage transistors are needed. In automotive applications, voltages as high as 60 volts or more are possible across the circuit. The DMOS (double diffused MOS) is currently the device of choice in this area.

DMOS transistors are fabricated in a self-aligned fabrication sequence. A channel region is usually first formed by dopant introduction of one type dopant (p or n impurities) through an aperture in a mask of gate-forming material to provide a channel region which is self-aligned with the gate. Then a source region is usually formed by dopant introduction of a type opposite to that of the channel region through the existing aperture so that the source is self-aligned to both the gate electrode and the channel region.

The DMOS transistor is widely used in integrated circuits in applications which require high power capabilities. In the 50 to 60 volt range there are other high power devices which could be used, but the DMOS allows the most current per unit area in this voltage range if low forward drop is required. However, the on-resistance of the conventional DMOS device should be improved to extend application areas. Making the smallest possible on-resistance represents a problem of prime importance in designing such power devices.

SUMMARY OF THE INVENTION

The described embodiment of the present invention provides a method and structure for a DMOS transistor structure with improved on-resistance. The structure uses conductive gate sidewalls. The gate sidewalls are formed of the same material as the central gate region, but are formed later in the process for self alignment purposes. The sidewalls allow the on-resistance of the transistor to be reduced without significantly changing the characteristics of the transistor.

The polycrystalline silicon gate of the DMOS transistor consists of two parts. The central gate region is formed first and is used for self alignment of a doped (channel) region in the substrate. Then the gate sidewalls are formed and a second doped region (which forms the source) is self aligned to the edges of the sidewalls. This process provides an optimization of the transistor for lower on-resistance.

This is a method of forming a DMOS transistor structure. The method comprises: forming a polycrystalline silicon central gate region; forming a channel region in the substrate self-aligned to the central gate region; forming polycrystalline silicon gate sidewalls adjacent to the gate region; and forming a source region in the substrate self-aligned to the edges of the sidewalls. A channel region which is significantly longer (Ld) than it is in depth (essentially Lj) can be produced between the source region and the drain region, and thus the method provides an optimization of the transistor for lower on-resistance. Thus this invention provides a DMOS device having a MOS channel length longer than its parasitic JFET channel length.

Preferably channel regions are formed which are 0.25-0.75 um in depth and the channel regions have an Ld of 1.0-2.5 um.

The invention also is a DMOS transistor comprising: a polycrystalline silicon gate consisting of a central gate region and gate sidewalls; a source region self-aligned to an edge of the gate sidewalls; a drain region having a portion on the substrate surface, the portion on the substrate surface being self-aligned to the central gate region; and a channel region, which is significantly wider than it is high, between the source region and the drain region.

DETAILED DESCRIPTION OF THE INVENTION

The DMOS (double diffused MOS) vertical transistor is a power device of choice in automotive and other power IC processes. On-resistance per unit area of this device for a given breakdown voltage is an important parameter for such a power device. The new design shown in FIG. 2 has an improved on-resistance as compared to the conventional design shown in FIG. 1. This improvement is on the order of a 25% reduction in the on-resistance and is described below.

Figure 1:
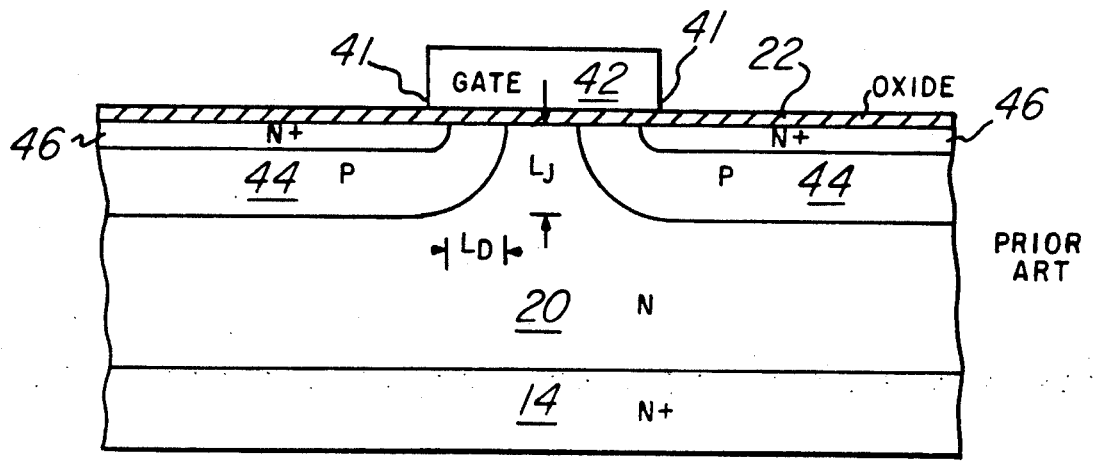
FIG. 1 is a cross sectional view of a prior art DMOS transistor structure.

Shown in FIG. 1 is the conventional fabrication for this DMOS (double diffused MOS) transistor structure. In this conventional fabrication sequence, both the edge 43 of p region 44 and edge 45 of n+ region 46 are self aligned to the edge 41 of the n+ poly region 42. Since n+ region 46 and p region 44 are both self aligned to the edge 41 of n+ poly region 42 (and edges 41a, 43a, and 45a are similarly related), the dimensions Lj and Ld are coupled and cannot be independently optimized. Lj is the parasitic JFET channel length which is approximately equal to the depth of the p region 44. Ld is the DMOS channel length which is the difference between Lj and the depth of the n+ region 46.

On-resistance per unit area for a given breakdown voltage is the most important parameter for this power device. One component of the on-resistance for the prior art device of FIG. 1 is the parasitic JFET resistance in the drain. The parasitic JFET resistance is proportional to Lj. Parasitic JFET resistance is increased because of the "neck" that is formed between adjacent depletion regions which pinches current flow through the distance Lj. The parasitic JFET resistance is explained in more detail in "Optimum Design of Power MOSFET's", Chenming Hu, IEEE Transactions on Electron Devices, Vol. ED-31, No. 12, December 1984. By reducing the length Lj, this region of pinched current flow will be decreased and the parasitic JFET resistance will be decreased. Therefore to reduce this resistance, Lj should be reduced. However this can not be arbitrarily reduced without affecting Ld in the prior art structure of FIG. 1. However, if the two quantities Lj and Ld are decoupled then Lj can be reduced while maintaining the desired transistor characteristics and the DMOS structure can be modified for lower on-resistance.

Figure 2:
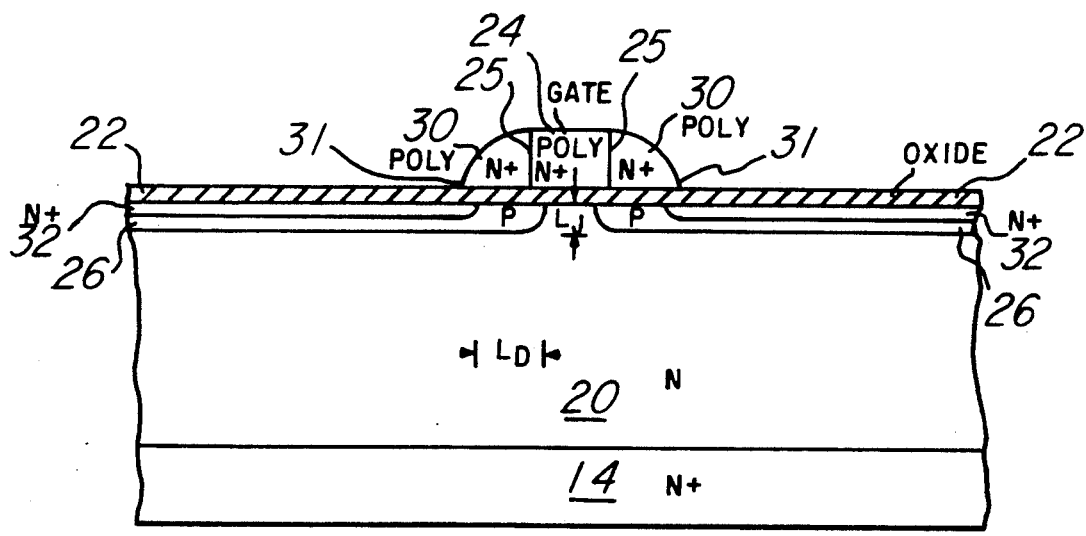
FIGS. 2 through 6 are cross sectional views showing the processing steps of a preferred embodiment of the present invention wherein a polycrystalline silicon gate of a DMOS transistor consists of two parts.

In the conventional method of FIG. 1, the parasitic JFET channel length Lj is larger than the DMOS channel length Ld. Because Lj is dependent on Ld in the conventional design in FIG. 1, Lj cannot be independently reduced in order to reduce the JFET resistance. A reduction in Lj of the conventional design of FIG. 1 would also reduce Ld. This would change the characteristics of the transistor in an unacceptable manner. The purpose of this new design in FIG. 2 is to decouple Lj and Ld so that Lj can be independently reduced in order to decrease the JFET resistance. The new DMOS device structure illustrated in FIGS. 2–6 decouples Lj and Ld such that Lj can be made smaller than Ld. This allows device optimization for a lower JFET resistance and a lower on-resistance per unit area.

A cross-sectional diagram of the new DMOS device constructed according to the invention is shown in FIG. 2. The gate 24 and 30 is formed of n+ doped polycrystalline silicon (n+ poly). The n+ poly which makes up the gate consists of two parts, the central region 24 which is similar to the conventional design in FIG. 1, and the sidewalls 30 which are used to decouple Lj and Ld. The gate is formed at the surface of oxide layer 22 which consists of silicon dioxide approximately 500 A thick. Oxide layer 22 is formed at the surface n-type substrate 20. Underlying the oxide layer 22 is a p region channel 26 which is self aligned to the edge 25 of the central gate region 24. The n+ region 32, which forms the source, is self aligned to the edge 31 of the gate sidewalls 30. N+ region 14 and n region 20 form the drain which provides the vertical current flow of the device.

Figure 3:
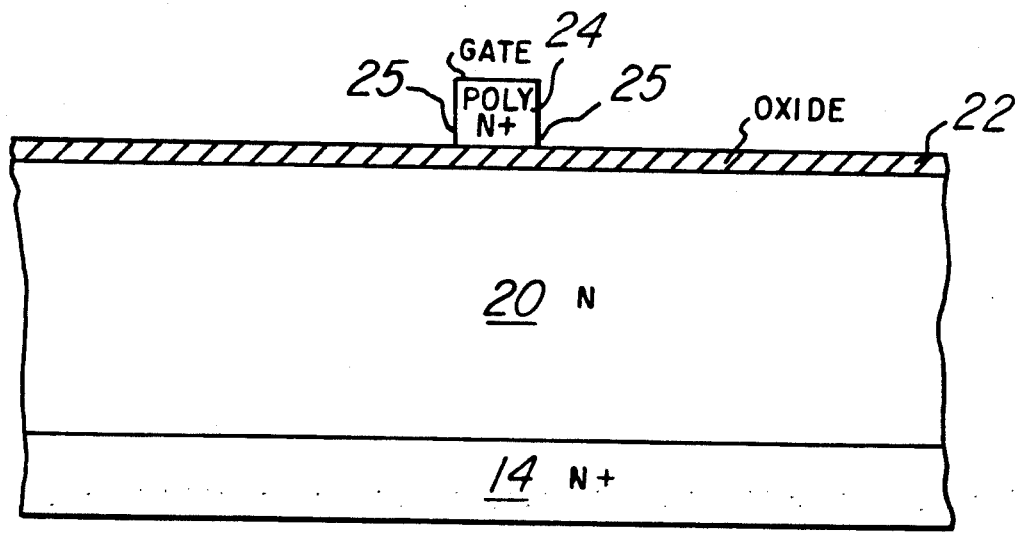

Referring to FIGS. 3 through 6, a method of forming the DMOS transistor of FIG. 2 is described in detail. FIG. 3 illustrates, in cross section, a partially fabricated gate with only the central portion of the gate poly region 24. The circuit is formed on an n-type epi 20 grown on an n+ silicon substrate 14. The silicon dioxide layer 22 is formed by local oxidation of silicon which is a process well known in the art. A polysilicon layer is then deposited over oxide layer 22, doped n+, patterned and etched to form the central gate region 24. The central gate region 24 is typically on the order of 1 um in height and 2-3 um in width.

Figure 4:
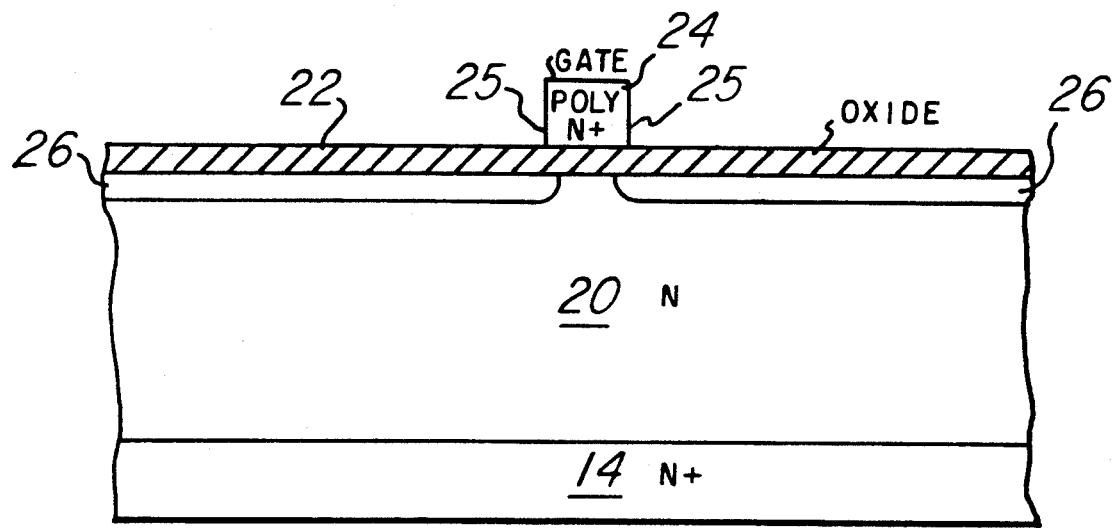
Figure 5:
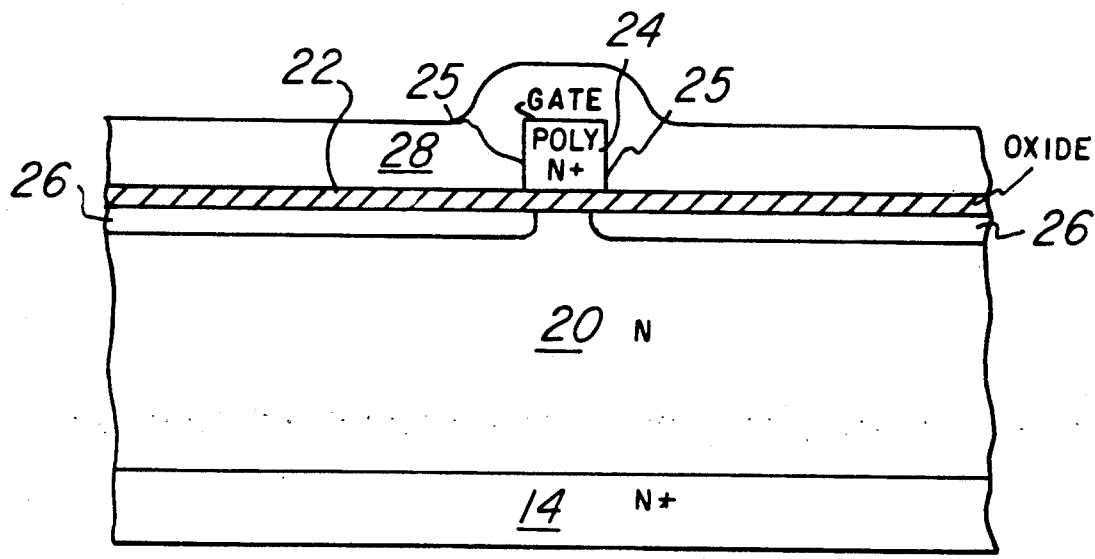
Figure 6:
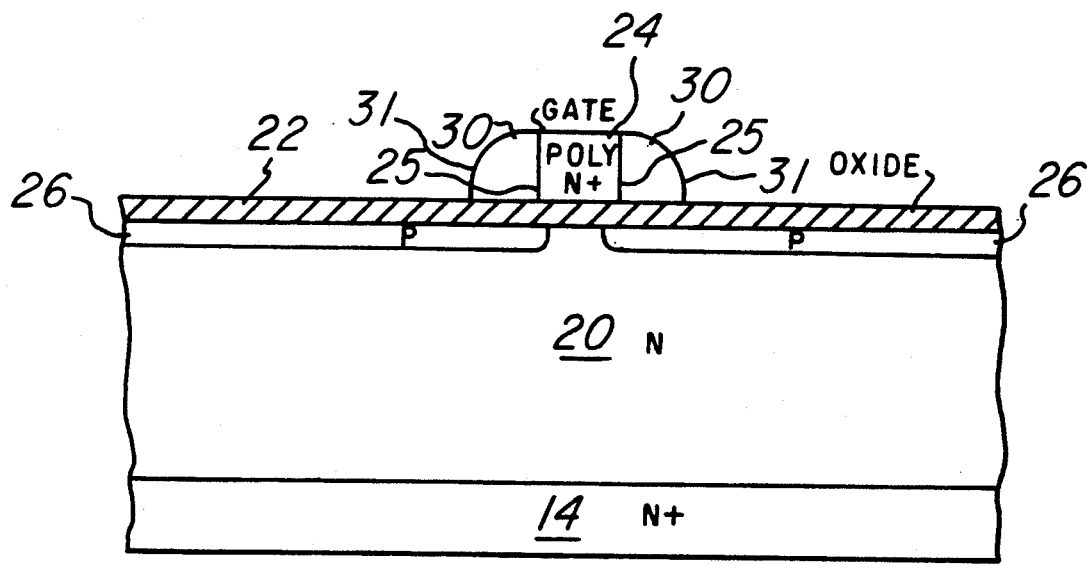

P-type region 26, shown in FIG. 4, is then formed (e.g. by an ion implantation of boron ions) into region 20 and diffused so that region 26 is self aligned to the edges 25 of n+ poly region 24. P-type region 26 is on the order of 0.5 um in depth which is approximately the parasitic JFET channel length Lj. A poly layer 28 is then deposited overall as shown in FIG. 5. Poly layer 28 is etched until the portion of poly layer 28 on planar areas is cleared leaving only the poly sidewalls 30 shown in FIG. 6. The width of poly sidewall 30 determines the DMOS channel length Ld which is approximately equal to the width of poly sidewall 30 (Ld's of this invention are preferably about 1–2.5 um ). Then n+ region 32 in FIG. 2 is formed (e.g. by an ion implantation arsenic ions) into p-type region 26. N+ region 32 in FIG. 2 is formed such that it is self aligned to the edges 31 of the poly sidewalls 30. Region 32 forms the source of the transistor. The interconnections have been left off of the Figures for simplicity.

The gate poly regions 24 and 30 are formed in different steps because the two regions serve as self aligning masks for the formation of p region 26 and n+ region 32, respectively. When the ions are implanted to form the doped regions 26 and 32, they diffuse laterally approximately the same distance that they do vertically. The ions spread out under the gate poly regions a distance equal to the depth of the doped region. Therefore, to decouple Ld and Lj, p region 26 and n+ region 32 are self-aligned to two different poly edges 25 and 31. The edges 25 of gate region 24 serve as a self aligning mask for the formation of p-type region 26. The edges 31 of gate sidewall 30 serve as a self aligning mask for the formation of n+ region 32. The gate sidewalls 30 allow Ld to remain the same length as in the conventional design while Lj has been reduced.

Lj in the new design in FIG. 2 is smaller than Ld and the JFET resistance is reduced. This gives a lower overall on-resistance which is the important parameter in this DMOS structure and is a significant improvement over the conventional device of FIG. 1. The total on-resistance is reduced on the order of 25%.

Although a specific embodiment of the present invention is herein described, it is not to be construed as limiting the scope of the present invention. For example, the conductivity types shown in the preferred embodiment may be reversed thus providing a P channel DMOS device. Many embodiments of the present invention will become clear to those skilled in the art in light of the teachings of the specification. The scope of the invention is limited only by the claims appended.

I claim:

1. A method of forming a DMOS vertical transistor structure on a substrate, said method comprising:
    forming n- epi drain region on an n+ substrate;
    forming a polycrystalline silicon central gate region;
    forming a first region in the substrate self-aligned to said central gate region;
    forming polycrystalline silicon gate sidewalls adjacent to said gate region; and
    forming a source region in a portion of said first region self-aligned to the edges of the sidewalls, whereby a remaining portion of said first region providing a channel region which is significantly wider than it is high can be produced between said source region and said drain region and thus a DMOS vertical transistor structure having a MOS channel length longer than its parasitic JFET channel length, and thus the method provides an optimization of the DMOS vertical transistor structure for lower on-resistance.

2. The method of claim 1, wherein said central gate region and said gate sidewalls are n+ poly.

3. The method of claim 1, wherein channel regions are formed which are 0.25–0.75 um in depth.

4. The method of claim 3, wherein said channel regions have an Ld of 1.0–2.5 um.

* * * * *